United States Patent
Kim

(10) Patent No.: US 8,067,839 B2
(45) Date of Patent: Nov. 29, 2011

(54) STACKED SEMICONDUCTOR PACKAGE AND METHOD FOR MANUFACTURING THE SAME

(75) Inventor: Sung Min Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/900,900

(22) Filed: Oct. 8, 2010

(65) Prior Publication Data

US 2011/0024893 A1   Feb. 3, 2011

Related U.S. Application Data

(62) Division of application No. 11/851,741, filed on Sep. 7, 2007, now Pat. No. 7,858,439.

(30) Foreign Application Priority Data

Jun. 21, 2007   (KR) .................... 10-2007-0061246

(51) Int. Cl.
H01L 23/48 (2006.01)
H01L 23/52 (2006.01)
H01L 29/40 (2006.01)

(52) U.S. Cl. ........ 257/774; 257/686; 257/690; 257/692; 257/773; 257/E23.011

(58) Field of Classification Search .................. 257/686, 257/692, 773, 774, 777
See application file for complete search history.

(56) References Cited

U.S. PATENT DOCUMENTS

| | | |
|---|---|---|
| 4,897,708 A | 1/1990 | Clements |
| 5,380,681 A | 1/1995 | Hsu |
| 5,481,133 A | 1/1996 | Hsu |
| 6,448,661 B1 | 9/2002 | Kim et al. |
| 6,577,013 B1 | 6/2003 | Glenn et al. |
| 7,122,457 B2 | 10/2006 | Tanida et al. |
| 7,579,667 B2 | 8/2009 | Brogan et al. |
| 2003/0107119 A1 | 6/2003 | Kim |
| 2005/0287783 A1 | 12/2005 | Kirby et al. |
| 2006/0102993 A1 | 5/2006 | Tsai et al. |
| 2006/0102995 A1* | 5/2006 | Tsai et al. ............ 257/686 |
| 2007/0018313 A1 | 1/2007 | Gomyo et al. |
| 2007/0181991 A1* | 8/2007 | Ishino et al. ........ 257/686 |
| 2008/0230923 A1 | 9/2008 | Jo et al. |
| 2009/0014891 A1 | 1/2009 | Chang et al. |

FOREIGN PATENT DOCUMENTS

CN   1553490 A   12/2004
(Continued)

OTHER PUBLICATIONS

USPTO OA mailed Jun. 12, 2009 for U.S. Appl. No. 11/851,741.
USPTO OA mailed Sep. 18, 2009 for U.S. Appl. No. 11/851,741.
(Continued)

*Primary Examiner* — Angel Roman, Jr.
(74) *Attorney, Agent, or Firm* — Ladas & Parry LLP

(57) ABSTRACT

Disclosed are a stacked semiconductor package and a method for manufacturing the same. The method for manufacturing a stacked semiconductor package includes preparing a substrate formed with a seed metal layer; laminating semiconductor chips having via holes aligned with one another on the seed metal layer to form a semiconductor chip module; and growing a conductive layer inside of the via holes using the seed metal layer to form a conductive growth layer inside of the via holes.

9 Claims, 9 Drawing Sheets

FOREIGN PATENT DOCUMENTS

| | | | |
|---|---|---|---|
| CN | 1655333 | A | 8/2005 |
| CN | 1744315 | A | 3/2006 |
| KR | 1999-52644 | A | 7/1999 |
| KR | 1020030046791 | A | 6/2003 |
| KR | 1020030050665 | A | 6/2003 |
| KR | 1020060068201 | A | 6/2006 |

OTHER PUBLICATIONS

USPTO OA mailed Mar. 31, 2010 for U.S. Appl. No. 11/851,741.
USPTO NOA mailed Jul. 9, 2010 for U.S. Appl. No. 11/851,741.
USPTO OA mailed Sep. 3, 2010 for U.S. Appl. No. 11/851,741.
USPTO OA mailed Oct. 8, 2010 for U.S. Appl. No. 11/851,741.

* cited by examiner

US 8,067,839 B2

STACKED SEMICONDUCTOR PACKAGE AND METHOD FOR MANUFACTURING THE SAME

CROSS-REFERENCE TO RELATED APPLICATIONS

The present application claims priority to Korean patent application number 10-2007-0061246 filed on Jun. 21, 2007, which is incorporated herein by reference in its entirety.

BACKGROUND OF THE INVENTION

The present invention relates to a stacked semiconductor package and a method for manufacturing the same.

Recently, semiconductor devices have been developed that are capable of storing massive data and processing the stored data in a short time.

Generally, a semiconductor package is manufactured through a semiconductor chip manufacturing process in which devices such as a transistor, a resistor, a capacitor and so on are integrated on a semiconductor chip formed on a wafer to form the semiconductor chip. Then, a packaging process occurs in which the semiconductor chip is separated from the wafer and is electrically connected to an external circuit board and packaged such that the highly brittle semiconductor chip can be protected from externally applied shocks and vibrations.

Recently, due to technical developments in a packaging process, a chip scale package has been developed having a size of no other than 100% to 105% of a semiconductor chip size and a stacked semiconductor package in which a plurality of semiconductor chips are stacked thereby enhancing data storage capacity and data processing speed.

In these packages, the stacked semiconductor package has a structure in that stacked semiconductor chips are connected with one another by conductors for signal input/output among the plurality of the stacked semiconductor chips.

In conventional stacked semiconductor packages, in order to connect stacked semiconductor chips to one another, each semiconductor chip or wafer formed with semiconductor chips is formed with via holes and the via hole is filled with conductive material thereby forming a conductor connected with the upper and lower semiconductor chips.

The semiconductor chips or wafers having a via hole filled with the conductor are stacked and consequently a stacked semiconductor package is manufactured, in which the conductors of the semiconductor chips are electrically connected with one another.

However, in order to manufacture the conventional stacked semiconductor package as described above, the conductor should be formed in every semiconductor chip or wafer, which involves a complicated manufacturing process.

In addition, the conventional stacked semiconductor package frequently suffers from a poor electric connection between the stacked semiconductor chips.

BRIEF SUMMARY OF THE INVENTION

Embodiments of the present invention are directed to a stacked semiconductor package, which simplifies a manufacturing process and prevents occurrence of poor electric connection between conductors connecting upper and lower semiconductor chips.

Further, embodiments of the present invention are directed to a method for manufacturing a stacked semiconductor package, which simplifies a manufacturing process and prevents occurrence of poor electric connection between conductors connecting upper and lower semiconductor chips.

In one embodiment, a stacked semiconductor package may comprise a semiconductor chip module having stacked semiconductor chips formed with via holes aligned with one another; and a conductive growth layer disposed inside of the aligned via holes and grown along the via holes.

A pair of the adjacent semiconductor chips is an attachment member for attaching the semiconductor chips.

The conductive growth layer is a plated layer.

Each semiconductor chip includes a recess part formed at a portion corresponding to the via hole; and a conductive pad formed on a bottom surface of the recess part, wherein the size of the via hole is smaller than that of the conductive pad. A side surface of the conductive growth layer corresponding to the recess part includes an extension part which is grown to the recess part and connected with the conductive pad.

The conductive growth layer projects to an upper surface of the semiconductor chip module.

The stacked semiconductor package may further comprise a substrate body on which the semiconductor chip module is mounted, connection pads disposed on the substrate body and electrically connected with the semiconductor chip module and a ball lands disposed on the substrate body and electrically connected with a conductor.

The stacked semiconductor package may further comprise a molding member for covering the semiconductor chip module.

The conductive growth layer is electrically connected with the connection pads and the connection pad is placed at the same position as that of the conductive growth layer.

In another embodiment, a method for manufacturing a stacked semiconductor package may comprise preparing a substrate formed with a seed metal layer; laminating semiconductor chips having via holes aligned with one another on the seed metal layer to form a semiconductor chip module; and growing a conductive layer inside of the via holes using the seed metal layer to form a conductive growth layer inside of the via holes.

The step of forming the semiconductor chip module includes disposing a first semiconductor chip having a first via hole on the seed metal layer; and attaching a second semiconductor chip having a second via hole aligned with the first via hole on the first semiconductor chip.

The step of disposing the first semiconductor chip on the seed metal layer includes forming a preliminary via hole having a depth smaller than a thickness of the first semiconductor chip on a surface of the first semiconductor chip; disposing the first semiconductor chip on the seed metal layer so that the preliminary via hole opposes to the seed metal layer; and decreasing the thickness of the first semiconductor chip to form the first via hole exposing the seed metal layer.

In the step of decreasing the thickness of the first semiconductor chip, the thickness of the first semiconductor chip is decreased by polishing process.

The step of forming the semiconductor chip module may further include, before the step of disposing the first semiconductor chip on the seed metal layer, forming a recess part in a portion of a surface of the first semiconductor chip corresponding to the preliminary via hole; and forming a pad on a bottom surface of the recess part.

The step of disposing the second semiconductor chip on the first semiconductor chip includes forming a preliminary via hole having a depth smaller than a thickness of the first semiconductor chip on a surface of the second semiconductor chip; disposing the second semiconductor chip on the first semiconductor chip so that the surface of the second semiconductor chip opposes the first via hole; and decreasing the thickness of the second semiconductor chip to form the second via hole exposing the first via hole.

In the step of decreasing the thickness of the second semiconductor chip, the thickness of the second semiconductor chip is decreased by any of a polishing process or an etching process.

The step of forming the semiconductor chip module may further include, before the step of disposing the second semiconductor chip having a second via hole on the first semiconductor chip, forming a recess part a portion of a surface of the second semiconductor chip corresponding to the preliminary via hole; and forming a pad on a bottom surface of the recess part.

In the step of forming the conductive growth layer, the conductive growth layer is grown by an electroplating.

In the step of forming the conductive growth layer, the conductive growth layer projects to an upper portion of the semiconductor chip module.

The method may further comprise, after the step of forming the conductive growth layer, separating the substrate from the semiconductor chip module; mounting the semiconductor chip module on the circuit substrate having connection pads; and molding the semiconductor chip module with a molding member.

DESCRIPTION OF SPECIFIC EMBODIMENTS

Figure 1:
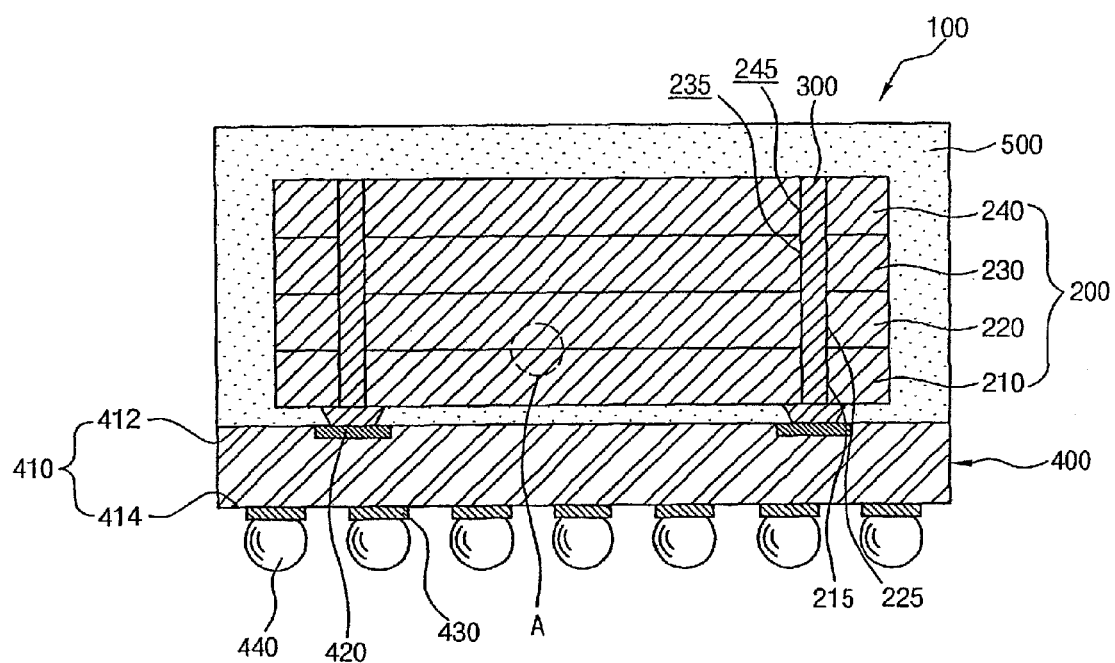
FIG. 1 is a cross-sectional view illustrating a stacked semiconductor package in accordance with an embodiment of the present invention.
Figure 2:
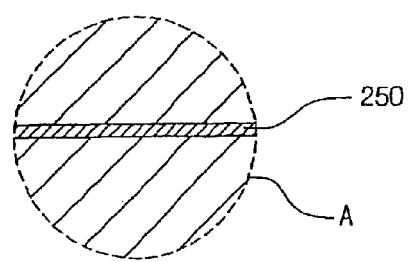
FIG. 2 is an enlarged view of a portion 'A' in FIG. 1.

FIG. 1 is a cross-sectional view illustrating a stacked semiconductor package in accordance with an embodiment of the present is invention. FIG. 2 is an enlarged view of a portion 'A' in FIG. 1.

Referring to FIG. 1, a stacked semiconductor package 100 includes a semiconductor chip module 200 and a conductive growth layer 300. In addition, the stacked semiconductor package 100 may further include a base substrate 400 and a molding member 500.

The base substrate 400 supports the semiconductor chip module 200. The base substrate 400 includes a substrate body 410, connection pads 420, ball lands 430 and solder balls 440.

The substrate body 410 has, for example, a shape of a rectangular plate. The substrate body 410 has a first surface 412 on which the semiconductor chip module 200 is mounted and a second surface 414 opposite to the first surface 412. The substrate body 410 may have circuit patterns include a plurality of layers and vias for connecting electrically the circuit patterns disposed in different layers to one another.

The connection pads 420 are disposed on the first surface 412 of the substrate body 410.

The ball land 430 is electrically connected to the connection pad 420 disposed on the first surface 412 of the substrate body 410 using the circuit pattern and via.

The solder ball 440 is electrically connected to the ball land 430 and the solder ball 440 is also electrically connected to a connection terminal of an external circuit board.

The semiconductor chip module 200 is disposed on the first is surface 412 of the substrate body 410 of the base substrate 400.

The semiconductor chip module 200 includes a plurality of semiconductor chips. In an embodiment of the present invention, the semiconductor chip module 200 includes, for example, a first semiconductor chip 210, a second semiconductor chip 220, a third semiconductor chip 230 and a fourth semiconductor chip 240. Although only four semiconductor chips 210, 220, 230 and 240 are described and illustrated in FIG. 1, unlike this the semiconductor chip module 200 may include at least two semiconductor chips.

Each of the first to fourth semiconductor chips 210, 220, 230 and 240 provided in the semiconductor chip module 200 includes at least a via hole.

Hereinafter, a via hole formed in the first semiconductor chip 210 will be referred as a first via hole 215, a via hole formed in the second semiconductor chip 220 as a second via hole 225, a via hole formed in the third semiconductor chip 230 as a third via hole 235 and a via hole formed in the fourth semiconductor chip 240 as a fourth via hole 245.

In an embodiment of the present invention, the first to fourth via holes 215, 225, 235 and 245 formed in the first to fourth semiconductor chips 210, 220, 230 and 240 respectively are aligned with one another, and consequently the first to fourth via holes 215, 225, 235 and 245 are communicated to one another.

Referring to FIG. 2, the first to fourth semiconductor chips 210, 220, 230 and 240 having the first to fourth via holes 215, 225, 235 and 245 respectively are attached to one another by attachment members 250.

The attachment members 250 are interposed, for example, between the first and second semiconductor chips 210 and 220, the second and third semiconductor chips 220 and 230 and the third and fourth semiconductor chips 230 and 240, respectively.

Referring to FIG. 1 again, the conductive growth layer 300 is disposed inside of the first to fourth via holes 215, 225, 235 and 245 communicated to one another.

In an embodiment of the present invention, the conductive growth layer 300 grows along the first to fourth via holes communicated to one another and consequently one conductive growth layer 300 disposed inside of the first to fourth via holes 215, 225, 235 and 245.

In a case of forming one conductive growth layer 300 inside the first to fourth via holes 215, 225, 235 and 245, a manufacturing process is significantly simplified because there is no need to form conductors in the first to fourth semiconductor chips 210, 220, 230 and 240 respectively.

Further, in the case of forming one conductive growth layer 300 inside of the inside of the first to fourth via holes 215, 225, 235 and 245, the first to fourth via holes 215, 225, 235 and 245 are electrically connected by one conductive growth layer 300 and thus a poor electrical connection among the first to fourth semiconductor chips 210, 220, 230 and 240 does not occur.

An end portion of the conductive growth layer 300 disposed in the first to fourth via holes 215, 225, 235 and 245 may project to some height from the fourth semiconductor chip 240 of the semiconductor chip module 200 consisting of the first to fourth semiconductor chips 210, 220, 230 and 240.

The end portion of the conductive growth layer 300 projecting from the fourth semiconductor chip 240 serves as a connection terminal.

The molding member 500 covers the semiconductor chip module 200 disposed on the first surface 412 of the base substrate 400. The molding member 500 prevents the semiconductor chip module 200 from being damaged due to an external impact and/or vibration. An example of material which can be used as the molding member 500 includes epoxy resin.

FIGS. 3 through 12 are cross-sectional views illustrating the process steps of a method for manufacturing the stacked semiconductor package in accordance with an embodiment of the present invention.

Figure 3:
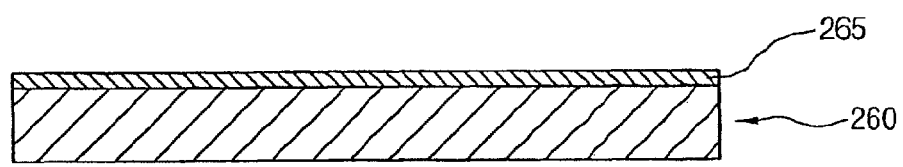
FIGS. 3 through 12 are cross-sectional views illustrating the process steps of a method for manufacturing the stacked semiconductor package in accordance with an embodiment of the present invention.

Referring to FIG. 3, in order to manufacture the stacked semiconductor package, a substrate 260 formed with a seed metal layer 265 is prepared. The substrate 260 preferably has a size at least larger than a size of the stacked semiconductor package. The substrate 260 may be made of metal or non-metal material.

The seed metal layer 265 is formed on a surface of the substrate 260. The seed metal layer 265 may be formed on the surface of the substrate 260 by a sputtering process, a chemical vapor deposition process, an electroplating process or an electroless plating process, etc. For example, when the substrate 260 is made of metal, the seed metal layer 265 may be formed by a sputtering process or an electroplating process. On the contrary, when the substrate 260 is made of non-metal material, the seed metal layer 265 may be formed by a sputtering process or an electroless plating process. Examples of materials that may be used as the seed metal layer 265 include titanium, nickel, vanadium, copper, aluminum, aluminum alloy, tungsten, tungsten alloy, chrome, chrome alloy, silver, gold and so on.

Figure 4:
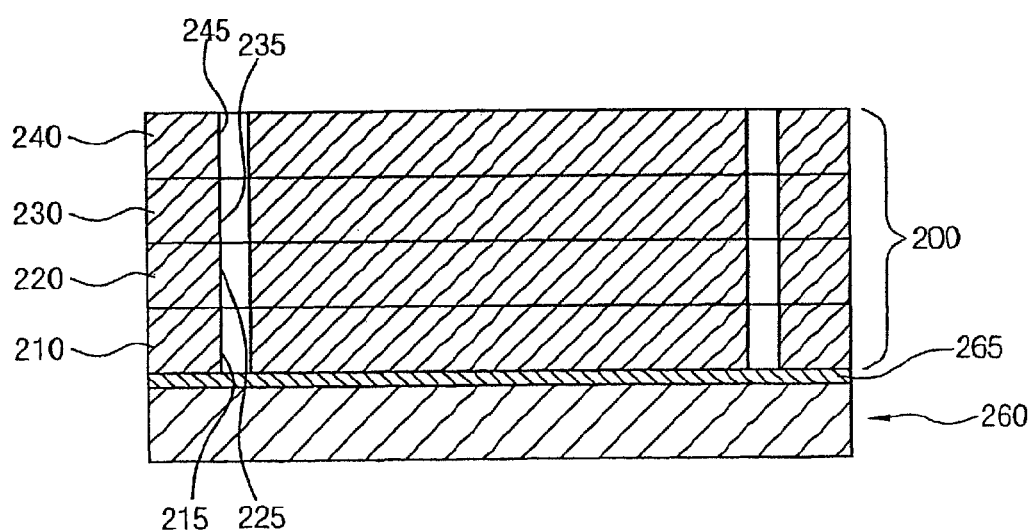

Referring to FIG. 4, the semiconductor chip module 200 is formed on the seed metal layer 265 of the substrate 260.

In order to manufacture the semiconductor chip module 200, the first semiconductor chip 210 having the first via hole 215 is disposed on the seed metal layer 265. The second semiconductor chip 220 having the second via hole 225 is then disposed on the first semiconductor chip 210.

Following, the third semiconductor chip 230 having the third via hole 235 is disposed on the second semiconductor chip 220. The fourth semiconductor chip 240 having the fourth via hole 245 is then disposed on the third semiconductor chip 230.

The first to fourth via holes 215, 225, 235 and 245 are aligned with one another and thus the seed metal layer 265 is exposed due to the first to fourth via holes 215, 225, 235 and 245.

Hereinafter, a method for forming the semiconductor chip module 200 on the seed metal layer will be described with reference to FIGS. 3 and 5 through 10.

Figure 5:
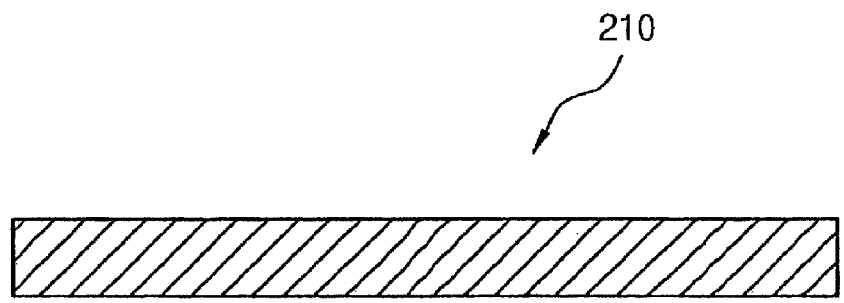

Referring to FIG. 5, the first semiconductor chip 210 is prepared for forming the semiconductor chip module 200.

Figure 6:
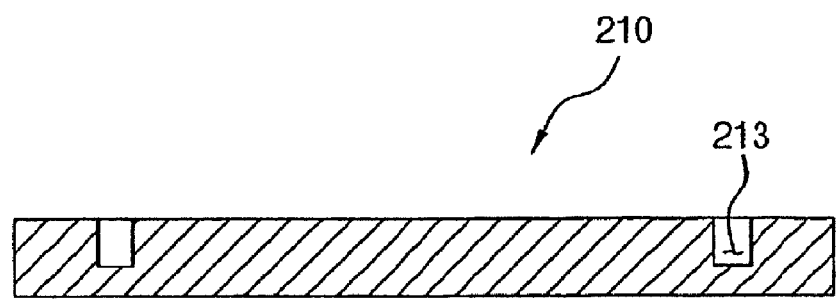

Referring to FIG. 6, a preliminary via hole 213 is formed on a surface of the first semiconductor chip 210. The preliminary via hole 213 may be formed from the surface of the first semiconductor chip 210 using a drilling, a laser drilling, and an etching process and so on. The preliminary via hole 213 has a depth smaller than a thickness of the first semiconductor chip 210.

Figure 7:
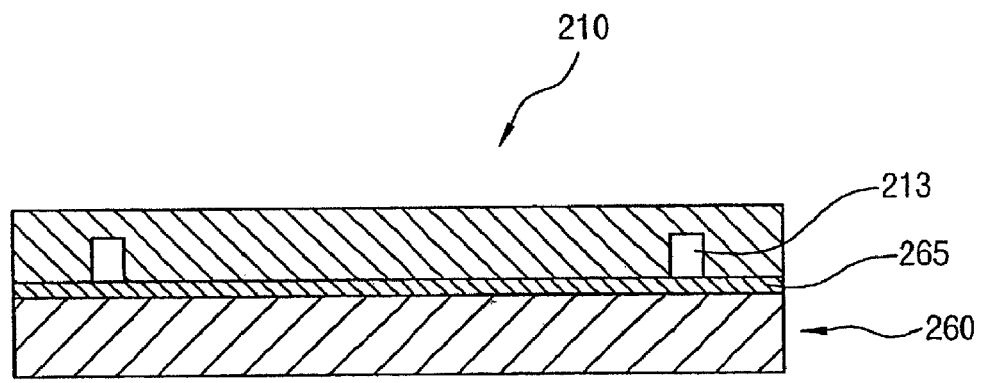

Referring to FIG. 7, one surface of the first semiconductor chip having the preliminary via hole 213 is oppositely disposed to the seed metal layer 265 of the substrate 260 shown in FIG. 3, and the one surface of the first semiconductor chip 210 is fixed onto the seed metal layer 265. The seed metal layer 265 and the preliminary via hole 213 may be adhered to each other, for example, by an adhesion member.

Figure 8:
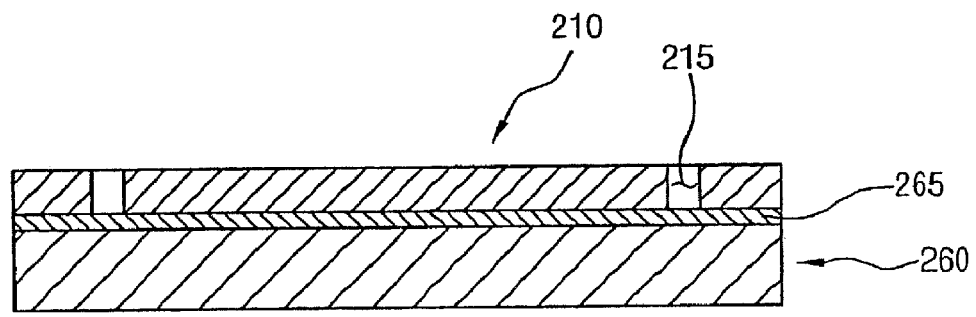

Referring to FIG. 8, after the first semiconductor chip 210 having the preliminary via hole 213 is fixed onto the seed metal layer 265, a process of decreasing the thickness of the first semiconductor chip 210 to form the first via hole 215 is carried out.

In an embodiment of the present invention, in order to decrease the thickness of the first semiconductor chip 210 to form the first via hole 215, a polishing process may be carried out, in which the other surface opposite to the one surface of the first semiconductor chip 210 is polished by CMP (chemical mechanical polishing) process. Alternately, in order to decrease the thickness of the first semiconductor chip 210 to form the first via hole 215, an etching process may be carried out, in which the other surface of the first semiconductor chip 210 is etched using an etchant.

Figure 9:
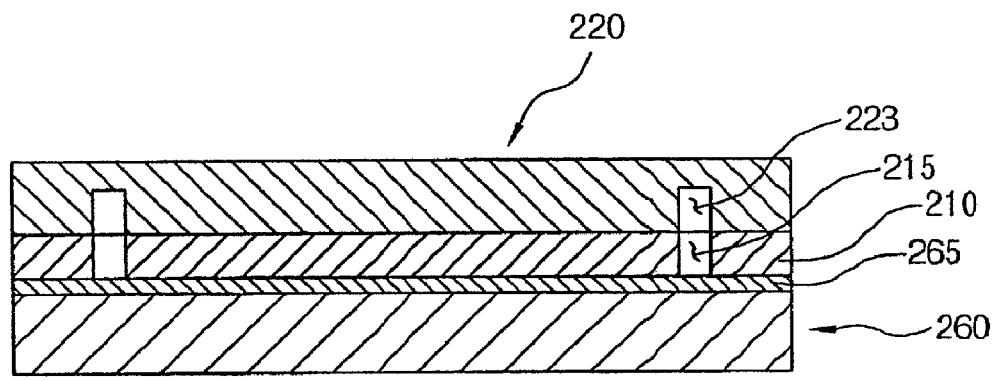

Referring to FIG. 9, the second semiconductor chip 220 formed with a preliminary via hole 223 is disposed again on the first semiconductor chip 210 having the first via hole 215. The preliminary via hole 223 of the second semiconductor chip 220 has a length of a depth smaller than a length of a thickness of the second semiconductor chip 220.

A surface of the second semiconductor chip 220 formed with the preliminary via hole 223 is fixed onto the first semiconductor chip 210. The second semiconductor chip 220 and the first semiconductor chip 210 may be adhered to each other by an adhesion member.

When the second semiconductor chip 220 is fixed onto the first semiconductor chip 210, the first via hole 215 of the first semiconductor chip 210 and the preliminary via hole 223 of the second semiconductor chip 220 are accurately aligned with each other.

Figure 10:
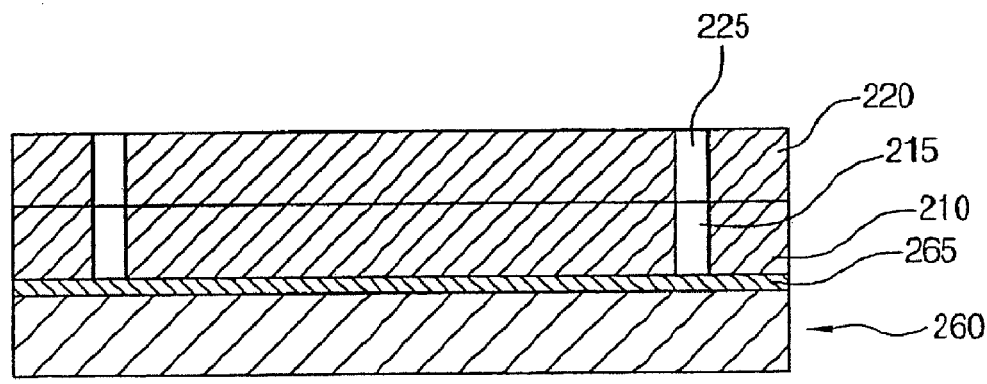

Referring to FIG. 10, after the first via hole 215 and the preliminary via hole 223 are aligned, the opposite surface of the second semiconductor chip 220 is polished or etched until the preliminary via hole 223 is exposed and consequently the second via hole 225 is formed in the second semiconductor chip 220.

Processes from FIG. 5 to FIG. 10 are repeated, thereby the first to fourth semiconductor chips 210, 220, 230 and 240 having the first to fourth via holes 215, 225, 235 and 245 respectively are formed on the seed metal layer 265 as shown in FIG. 4. At this time, the first to fourth via holes 215, 225, 235 and 245 are aligned with one another and the semiconductor chip module 200 is formed on the seed metal layer 265.

Figure 11:
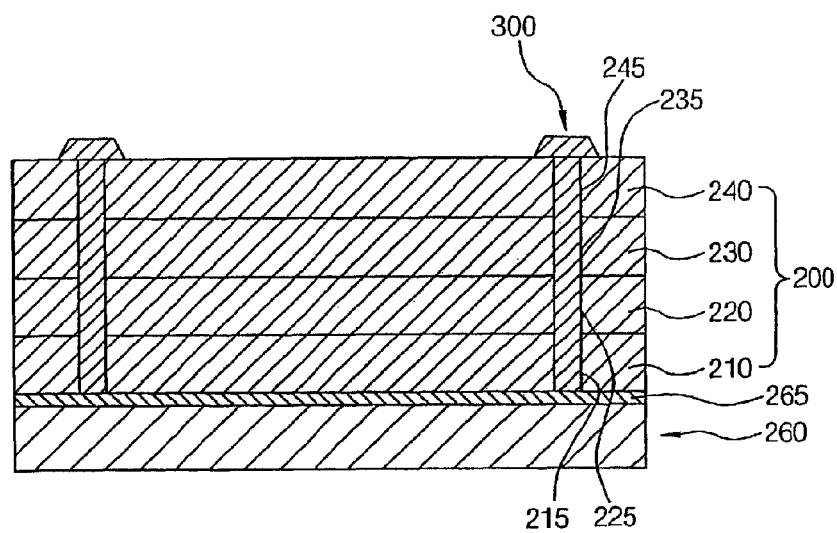

Referring to FIG. 11, after the semiconductor chip module 200 is formed on the seed metal layer 265, the conductive growth layer 300 is formed in the first to fourth via holes 215, 225, 235 and 245 using the seed metal layer 265. The conductive growth layer 300 may be formed inside of the first to fourth via holes 215, 225, 235 and 245, for example, by an electroplating.

The conductive growth layer 300 is continuously grown from the seed metal layer 265 inside of the first to fourth via holes 215, 225, 235 and 245 and fill the first to fourth via holes 215, 225, 235 and 245. In addition, the conductive growth layer 300 is grown so that an end portion thereof projects to an outside of the fourth via hole 245.

Since one conductive growth layer 300 is grown inside of the to first to fourth via holes 215, 225, 235 and 245, the manufacturing process is significantly simplified.

Further, in the case that one conductive growth layer 300 is grown inside of the first to fourth via holes 215, 225, 235 and 245, the first to fourth via holes 215, 225, 235 and 245 are connected with one another by one conductive growth layer 300 and thus poor electrical connection among the first to fourth semiconductor chips 210, 220, 230 and 240 does not occur.

Figure 12:
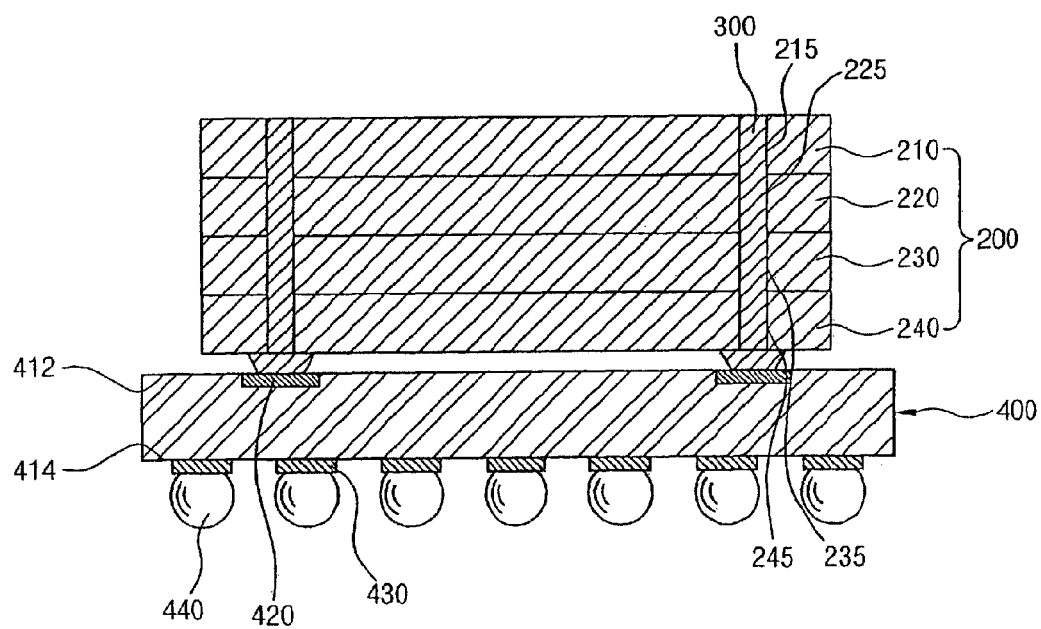

Referring to FIG. 12, after the conductive growth layer 300 is grown inside of the first to fourth via holes 215, 225, 235 and 245 to fill the first to fourth via holes 215, 225, 235 and 245, the seed metal layer 265 and substrate 260 are separated from the semiconductor chip module 200.

Subsequently, the conductive growth layer 300 projecting from the fourth via hole 245 formed in the fourth semiconductor chip 240 of the semiconductor chip module 200 is electrically connected to the connection pad 420 formed on the first surface 412 of the base substrate 400. The ball land 430 is formed on the second surface 414 opposing to the first surface 412 and the solder ball 440 is formed on the ball land 430.

Subsequently, as shown in FIG. 1, the semiconductor chip module 200 and the base substrate 400 are covered with the molding member thereby manufacturing the stacked semiconductor package 100.

Figure 13:
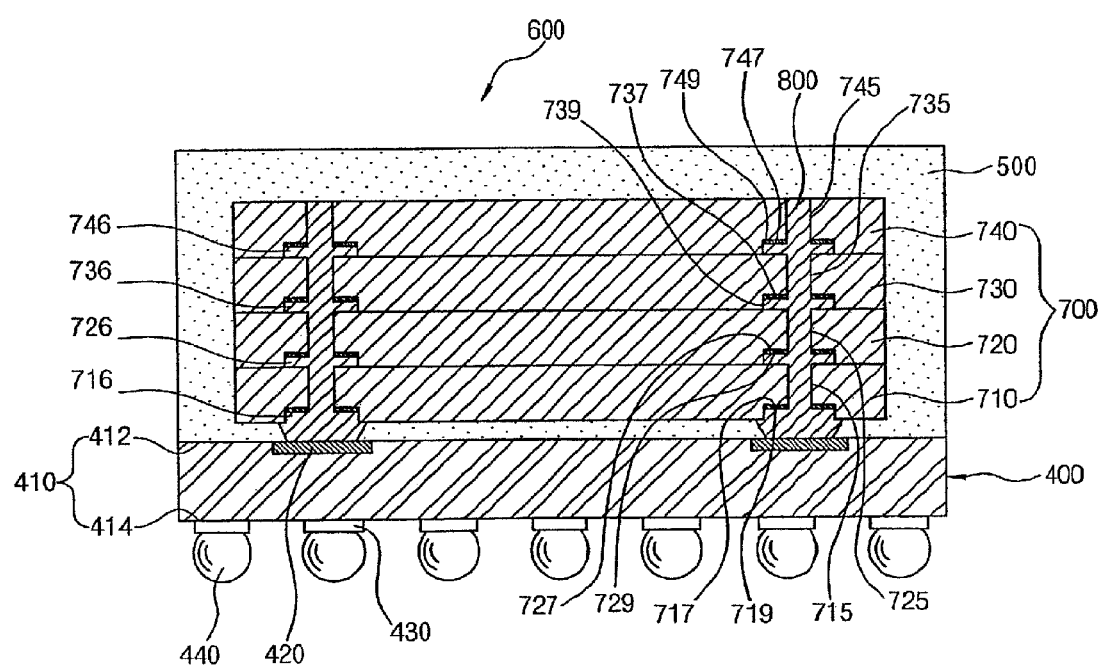
FIG. 13 is a cross-sectional view illustrating a stacked semiconductor package in accordance with another embodiment of the present invention.

FIG. 13 is a cross-sectional view illustrating a stacked semiconductor package in accordance with another embodiment of the present invention.

Referring to FIG. 13, a stacked semiconductor package 600 includes a semiconductor chip module 700 and a conductive growth layer 800. In addition, the stacked semiconductor package 600 may further include a base substrate 400 and a molding member 500.

The semiconductor chip module 600 is supported on the base substrate 400.

The substrate body 410 has substantially a shape of a rectangular plate. The substrate body 410 has a first surface 412 and a second surface 414 and the first surface 412 and the second surface are opposite to each other. The substrate body 410 may include circuit patterns and vias connecting electrically the circuit patterns with one another. The circuit pattern may consist of a plurality of layers connected with one another by the vias.

The connection pads 420 are disposed on the first surface 412 of the substrate body 410 and the ball land 430 is electrically connected to the connection pad 420 disposed on the first surface 412 of the substrate body 410 through the circuit pattern and via.

The solder ball 440 is electrically connected to the ball land 430 and the solder ball 440 is also electrically connected to a connection terminal of an external circuit board.

The semiconductor chip module 700 is disposed on the first surface 412 of the substrate body 410 of the base substrate 400.

The semiconductor chip module 700 includes a plurality of semiconductor chips. In another embodiment of the present invention, the semiconductor chip module 700 includes a first semiconductor chip 710, a second semiconductor chip 720, a third semiconductor chip 730 and a fourth semiconductor chip 740.

Each of the first to fourth semiconductor chips 710, 720, 730 and 740 provided in the semiconductor chip module 700 includes at least a via hole. Hereinafter, a via hole formed in the first semiconductor chip 710 will be referred as a first via hole 715, a via hole formed in the second semiconductor chip 720 as a second via hole 725, a via hole formed in the third semiconductor chip 730 as a third via hole 735 and a via hole formed in the fourth semiconductor chip 740 as a fourth via hole 745.

In another embodiment of the present invention, the first to fourth via holes 715, 725, 735 and 745 formed in the first to fourth semiconductor chips 710, 720, 730 and 740 respectively are aligned with one another, and consequently the first to fourth via holes 715, 725, 735 and 745 are communicated to one another.

The first to fourth semiconductor chips 710, 720, 730 and 740 having the first to fourth via holes 715, 725, 735 and 745 respectively are attached to one another by attachment members (not shown). For example, the attachment members are interposed between the first and second semiconductor chips 710 and 720, the second and third semiconductor chips 720 and 730 and the third and fourth semiconductor chips 730 and 740, respectively.

Meanwhile, first to fourth recess parts 717, 727, 737 and 747 are formed at respective portion of the first to fourth semiconductor chips 710, 720, 730 and 740 where the first to fourth via holes 715, 725, 735 and 745 are formed respectively.

The first to fourth recess parts 717, 727, 737 and 747 are formed so that they have a size larger than the size of the first to fourth via holes 715, 725, 735 and 745. First to fourth pads 719, 729, 739 and 749 are formed on the first to fourth recess parts 717, 727, 737 and 747 respectively.

The first to fourth via holes 715, 725, 735 and 745 pass through the first to fourth pads 719, 729, 739 and 749 are formed on the first to fourth recess parts 717, 727, 737 and 747 and centers of the first to fourth recess parts 717, 727, 737 and 747.

The conductive growth layer 800 is disposed inside of the first to fourth via holes 715, 725, 735 and 745 communicated to one another. In addition, the conductive growth layer 800 is grown to spaces formed by the first to fourth recess parts 717, 727, 737 and 747 and thus extension parts 716, 726, 736 and 746 are disposed in the spaces formed by the first to fourth recess parts 717, 727, 737 and 747.

In another embodiment of the present invention, the conductive growth layer 800 grows along the first to fourth via holes communicated to one another and consequently one conductive growth layer 800 disposed inside of the first to fourth via holes 715, 725, 735 and 745.

In a case of forming one conductive growth layer 800 inside of the first to fourth via holes 715, 725, 735 and 745, a manufacturing process is significantly simplified because there is no need to form conductors in the first to fourth semiconductor chips 710, 720, 730 and 740 respectively.

Further, in the case of forming one conductive growth layer 800 inside of the first to fourth via holes 715, 725, 735 and 745, the first to fourth via holes 715, 725, 735 and 745 are electrically connected by one conductive growth layer 800 and thus a poor electrical connection among the first to fourth semiconductor chips 710, 720, 730 and 740 does not occur.

An end portion of the conductive growth layer 800 disposed in the first to fourth via holes 715, 725, 735 and 745 may project from the fourth semiconductor chip 740 of the semiconductor chip module 600 consisting of the first to fourth semiconductor chips 710, 720, 730 and 740. The end portion of the conductive growth layer 800 projecting from the fourth semiconductor chip 940 serves as a connection terminal.

The molding member 500 covers the semiconductor chip module 600 disposed on the first surface 412 of the base substrate 400. The molding member 500 prevents the semiconductor chip module 600 from being damaged due to an external impact and/or vibration. An example of material which can be used as the molding member 500 includes epoxy resin.

FIGS. 3 and 14 through 17 are cross-sectional views illustrating the process steps of a method for manufacturing the stacked semiconductor package in accordance with another embodiment of the present invention.

Figure 14:
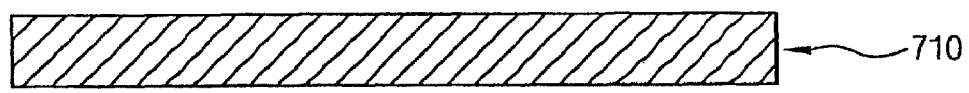
FIGS. 14 through 17 are cross-sectional views illustrating the process steps of a method for manufacturing the stacked semiconductor package in accordance with another embodiment of the present invention.

Referring to FIG. 14, in order to manufacture the stacked semiconductor package, a substrate 260 formed with a seed metal layer 265 as shown in FIG. 3 is prepared. The substrate 260 preferably has a size at least larger than a size of the stacked semiconductor package. The substrate 260 may be made of metal or non-metal material.

The seed metal layer 265 is formed on a surface of the substrate 260. The seed metal layer 265 may be formed on the surface of the substrate 260 by a sputtering process, an electroplating process or an electroless plating process, etc. For example, in a case that the substrate 260 is made of metal, the seed metal layer 265 may be formed by a sputtering process or an electroplating process. On the contrary, in a case that the substrate 260 is made of non-metal material, the seed metal layer 265 may be formed by a sputtering process or an electroless plating process. Examples of material which can be used as the seed metal layer 265 include titanium, nickel, vanadium, copper, aluminum, aluminum alloy, tungsten, tungsten alloy, chrome, chrome alloy, silver, gold and so on.

Referring to FIG. 14, the first semiconductor chip 710 is prepared in order to form the semiconductor chip module 700 on the seed metal layer 265.

Figure 15:
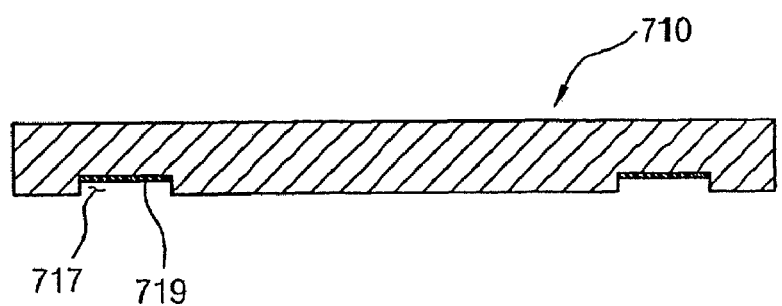

Referring to FIG. 15, the recess part 717 placed a portion where the first via hole which will be described later is to be formed is formed in the first semiconductor chip 710. The recess part 717 may be formed through a photolithography process. After forming the recess part 717, the first pad 719 connected with the first semiconductor chip 710 is formed on a bottom surface of the recess part 717.

Figure 16:
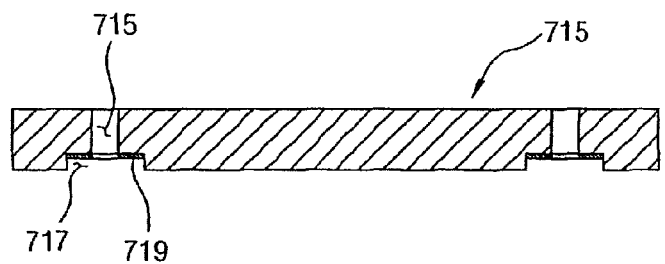

Referring to FIG. 16, the first via hole 715 is formed on a surface of the first semiconductor chip 710. The first via hole 715 may be formed through a drilling or laser drilling process.

Figure 17:
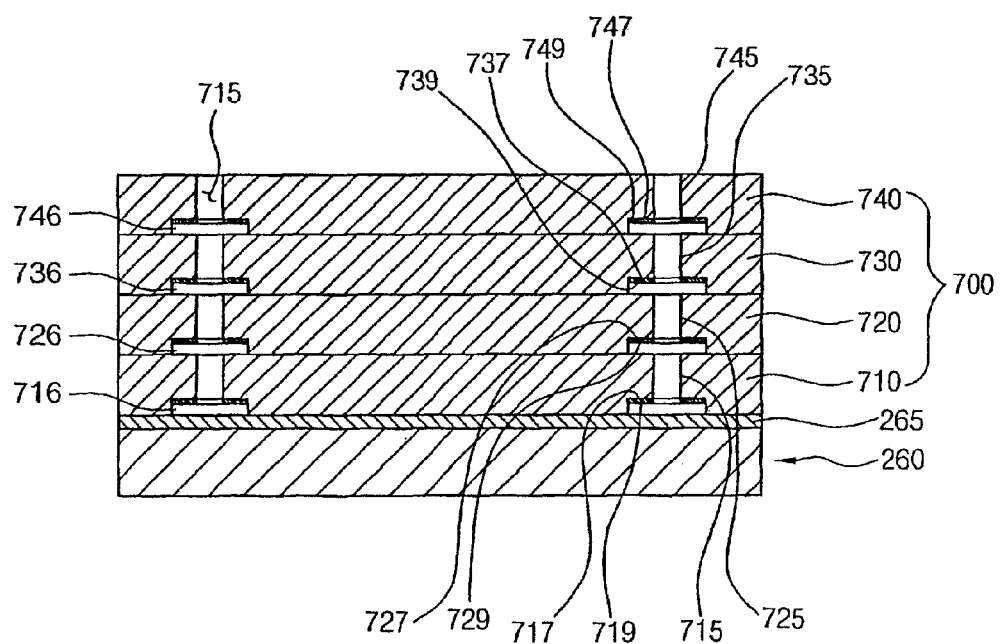

Referring to FIG. 17, the second semiconductor chip 720, the third semiconductor chip 730 and the fourth semiconductor chip 740 having substantially the same structure as the first semiconductor chip 710 are sequentially disposed on the seed metal layer 265. In another embodiment of the present invention, a space is formed between the first semiconductor chip 710 and the second semiconductor chip 720 by the second recess part 727. Further, a space is also formed between the second semiconductor chip 720 and the third semiconductor chip 730 by the third recess part 737 and a space is also formed between the third semiconductor chip 730 and the fourth semiconductor chip 740 by the fourth recess part 747.

Referring to FIG. 13 again, after the semiconductor chip module 700 is formed on the seed metal layer 265, the conductive growth layer 800 is formed in the first to fourth via holes 715, 725, 735 and 745 using the seed metal layer 265. The conductive growth layer 800 may be formed inside of the first to fourth via holes 715, 725, 735 and 745, for example, by an electroplating.

The conductive growth layer 800 is continuously grown from the seed metal layer 265 inside of the first to fourth via holes 715, 725, 735 and 745 and fill the first to fourth via holes 715, 725, 735 and 745. In addition, the conductive growth layer 800 is grown so that an end portion thereof projects to an outside of the fourth via hole 745.

In the case that one conductive growth layer 800 is grown inside of the first to fourth via holes 715, 725, 735 and 745, the manufacturing process is significantly simplified because there is no need to form conductors in the first to fourth semiconductor chips 710, 720, 730 and 740 respectively.

Further, in the case that one conductive growth layer 800 is grown inside of the first to fourth via holes 715, 725, 735 and 745, the first to fourth via holes 715, 725, 735 and 745 connected with one another by one conductive growth layer 800 and thus poor electrical connection among the first to fourth semiconductor chips 710, 720, 730 and 740 does not occur.

After the conductive growth layer 800 is grown inside of the first to fourth via holes 715, 725, 735 and 745 to fill the first to fourth via holes 715, 725, 735 and 745, the seed metal layer 265 and substrate 260 are separated from the semiconductor chip module 700.

Subsequently, the conductive growth layer 800 projecting from the fourth via hole 745 formed in the fourth semiconductor chip 740 of the semiconductor chip module 700 is electrically connected to the connection pad 420 formed on the first surface 412 of the base substrate 400. The ball land 430 is formed on the second surface 414 opposing to the first surface 412 and the solder ball 440 is formed on the ball land 430.

Subsequently, the semiconductor chip module 700 and the base substrate 400 are covered with the molding member 500 thereby manufacturing the stacked semiconductor package 600.

As is apparent from the above description, in an embodiment of the present invention, a process for manufacturing a stacked semiconductor package is significantly simplified and poor electrical connection among the semiconductor chips constructing the stacked semiconductor package can be solved.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
    a semiconductor chip module having a plurality of stacked semiconductor chips formed with via holes aligned with one another; and
    a conductive growth layer disposed inside of the aligned via holes and grown along the via holes,
    wherein each semiconductor chip includes a recess part formed at a portion corresponding to the via hole and a conductive pad formed on a bottom surface of the recess part,
    wherein a side surface of the conductive growth layer corresponding to the recess part includes an extension part which is grown to the recess part and connected with the conductive pad.

2. The stacked semiconductor package according to claim 1, wherein between a pair of adjacent semiconductor chips is an attachment member for attaching the semiconductor chips.

3. The stacked semiconductor package according to claim 1, wherein the conductive growth layer is a plated layer.

4. The stacked semiconductor package according to claim 1, wherein the size of the via hole is smaller than that of the conductive pad.

5. The stacked semiconductor package according to claim 1, wherein the conductive growth layer projects to an upper surface of the semiconductor chip module.

6. The stacked semiconductor package according to claim 1, further comprising:
    a substrate body on which the semiconductor chip module is mounted,
    connection pads disposed on the substrate body and electrically connected with the semiconductor chip module; and
    a ball lands disposed on the substrate body and electrically connected with a conductor.

7. The stacked semiconductor package according to claim 6, further comprising a molding member for covering the semiconductor chip module.

8. The stacked semiconductor package according to claim 6, wherein the conductive growth layer is electrically connected with the connection pads.

9. The stacked semiconductor package according to claim 8, wherein the connection pads are placed at the same position as that of the conductive growth layer.

* * * * *